(12) United States Patent
Kim et al.

(10) Patent No.: US 11,150,809 B2
(45) Date of Patent: Oct. 19, 2021

(54) MEMORY CONTROLLER AND STORAGE DEVICE INCLUDING THE SAME

(71) Applicant: FADU Inc., Seoul (KR)

(72) Inventors: Eui Jin Kim, Seongnam-si (KR); Hongseok Kim, Seoul (KR); EHyun Nam, Seoul (KR); Kyoungmoon Sun, Seoul (KR)

(73) Assignee: FADU Inc., Seoul (KR)

( * ) Notice: Subject to any disclaimer, the term of this patent is extended or adjusted under 35 U.S.C. 154(b) by 0 days.

(21) Appl. No.: 16/993,686

(22) Filed: Aug. 14, 2020

(65) Prior Publication Data

US 2021/0096985 A1    Apr. 1, 2021

Related U.S. Application Data

(60) Provisional application No. 62/908,644, filed on Oct. 1, 2019.

(51) Int. Cl.
| | |
|---|---|
| *G06F 12/00* | (2006.01) |
| *G06F 3/06* | (2006.01) |
| *G06F 12/02* | (2006.01) |
| *G06F 12/06* | (2006.01) |
| *G06F 12/0882* | (2016.01) |
| *G06F 11/07* | (2006.01) |
| *G06F 9/4401* | (2018.01) |
| *G11C 16/16* | (2006.01) |

(Continued)

(52) U.S. Cl.
CPC .......... *G06F 3/0611* (2013.01); *G06F 3/0652* (2013.01); *G06F 3/0679* (2013.01); *G06F 9/4418* (2013.01); *G06F 11/076* (2013.01); *G06F 11/3037* (2013.01); *G06F 12/0246* (2013.01); *G06F 12/0646* (2013.01); *G06F 12/0882* (2013.01); *G11C 16/16* (2013.01); *G11C 16/349* (2013.01); *G06F 2212/7209* (2013.01)

(58) Field of Classification Search
None
See application file for complete search history.

(56) References Cited

U.S. PATENT DOCUMENTS 10,643,711 B1 * 5/2020 Yuan .................. G11C 16/26
2017/0168752 A1 * 6/2017 Micheloni ............ G06F 3/0604
(Continued)

*Primary Examiner* — Daniel D Tsui
(74) *Attorney, Agent, or Firm* — NSIP Law

(57) ABSTRACT

A memory controller and a storage device including the same are provided. The memory controller includes a memory channel controller configured to perform erase/program, read, and erase/program suspend operations for a flash memory, a flash translation layer configured to control an operation of the memory channel controller by receiving a write/read command, and transmit a completion for the write/read command, a host interface configured to receive the write/read command from a host, transmit the write/read command to the flash translation layer, receive the completion from the flash translation layer, and calculate a write/read latency for the write/read command based on the completion, and a suspend-limit changer configured to dynamically change an erase/program suspend-limit based on the calculated write/read latency, the erase/program suspend-limit being a maximum allowed number of erase/program suspend operations.

11 Claims, 3 Drawing Sheets

(51) Int. Cl.
*G11C 16/34* (2006.01)
*G06F 11/30* (2006.01)

(56) References Cited

U.S. PATENT DOCUMENTS

2017/0194053 A1* 7/2017 Micheloni .............. G11C 5/005
2019/0243577 A1* 8/2019 Pelster ................. G06F 3/0679

* cited by examiner

«MEMORY CONTROLLER AND STORAGE DEVICE INCLUDING THE SAME»

CROSS-REFERENCE TO RELATED APPLICATION

This application claims the benefit under 35 U.S.C. § 119(e) of U.S. Provisional Application No. 62/908,644 filed on Oct. 1, 2019, in the U.S. Patent and Trademark Office, the entire disclosure of which is incorporated herein by reference for all purposes.

BACKGROUND

1. Field

The disclosure relates to a memory controller and a storage device including the same, and more particularly, to a memory control technique for dynamically changing and controlling an allowed number of erase/program suspend operations.

2. Description of Related Art

Semiconductor memories are categorized into volatile memory and non-volatile memory according to the storage mechanisms of information. Volatile memories include dynamic random access memory (DRAM) and static random access memory (SRAM). Although the volatile memory provides fast read and write speeds, the volatile memory loses stored information when it is powered off. In contrast, the non-volatile memory maintains its stored information even after it is powered off and thus is used as a storage medium for persistent storage devices such as solid-state drives (SSDs). Non-volatile memories include erasable programmable read only memory (EPROM), electrically erasable programmable read only memory (EEPROM), ferroelectric RAM (FRAM), phase change RAM (PRAM), magnetoresistive RAM (MRAM), and flash memory. Particularly, the flash memory is widely used as an audio and video data storage medium for information devices such as a computer, a smartphone, a digital camera, a voice recorder, and a camcorder.

There are multiple outstanding host read/write commands in a flash memory based storage device due to multiple concurrent tasks inside the storage device such as host command processing, buffer flush, garbage collection (GC), etc. Due to the queuing effect caused by multiple commands, the host command processing latencies are not constant and have a specific distribution. It is preferable that the width of the latency distribution is narrow because latencies are easily predictable on the part of a host. That is, as latencies are more consistent (i.e., the distribution width is narrower), quality of service (QoS) of the storage device is more excellent. Conventionally, write buffering is used to improve write QoS, and erase/program suspend is used to improve read QoS. However, when an allowed number of erase/program suspend operations is set to be too small, read QoS is decreased, whereas when the allowed number of erase/program suspend operations is set to be too large, write QoS is decreased. Particularly, when too many suspend operations are allowed, erase or program throughput is lowered, thereby degrading buffer flush or GC performance. In this case, the resulting late buffer flush causes a full buffer, or the resulting late GC leads to exhaustion of free blocks and hence delayed write command processing.

There is thus a pressing need for a method of improving the QoS of a flash storage device to overcome the conventional problem.

SUMMARY

The present disclosure has been made in an effort to solve the above-mentioned problems of the prior art and an aspect of the present disclosure is to provide a memory controller for dynamically changing an allowed number of erase/program suspend operations.

According to an embodiment of the disclosure, a memory controller includes memory channel controllers configured to perform erase, program, read, and erase/program suspend operations for flash memories, a flash translation layer configured to control the memory channel controllers to process write/read commands, and transmit completions for the write/read commands, a host interface configured to forward the write/read commands from a host to the flash translation layer, forward the completions from the flash translation layer to the host, and calculate write/read latencies for the write/read commands when forwarding the associated completions, and a suspend-limit changer configured to dynamically change an erase/program suspend-limit based on the calculated write/read latencies, the erase/program suspend-limit being a maximum allowed number of erase/program suspend operations.

In the memory controller according to an embodiment of the disclosure, the host interface may be configured to generate a timestamp when receiving a write/read command, transmit the timestamp along with the write/read command, receive the timestamp along with the completion, calculate the write/read latency based on a difference between the timestamp and a reception time of the timestamp, and reflect the calculated write/read latency in a write/read latency data structure in which the number of write commands and the number of read commands are recorded for each of latency items defined as specific time ranges.

The memory controller according to an embodiment of the disclosure may further include a memory configured to store the write/read latency data structure.

In the memory controller according to an embodiment of the disclosure, the suspend-limit changer may be configured to calculate a write consistency-level and a read consistency-level based on the write/read latency data structure, the write consistency-level and the read consistency-level being used for evaluating a latency variation, and determine the erase/program suspend-limit based on an evaluation result from comparing the write consistency-level and the read consistency-level.

In the memory controller according to an embodiment of the disclosure, the write consistency-level may be calculated by Equation 1, and the read consistency-level may be calculated by Equation 2:

$$\text{Write consistency-level} = (MW_{Latency})/(SW_{Latency}) \quad (1)$$

$$\text{Read consistency-level} = (MR_{Latency})/(SR_{Latency}) \quad (2)$$

where $MW_{Latency}$ is an average latency for write commands, $SW_{Latency}$ is a standard deviation of latency for the write commands, $MR_{Latency}$ is an average latency for read commands, and $SR_{Latency}$ is a standard deviation of latency for the read commands.

In the memory controller according to an embodiment of the disclosure, the suspend-limit changer may be configured to use a level difference calculated by subtracting the read consistency-level from the write consistency-level as the evaluation result, and determine a program suspend-limit in the erase/program suspend-limit according to the following condition, If diff<0, p-limit=0.
If diff≥0, p-limit=[diff]

where diff is the level difference, p-limit is the program suspend-limit, and [ ] is a function of converting a real number to an integer.

In the memory controller according to an embodiment of the disclosure, the suspend-limit changer may be configured to determine an erase suspend-limit by Equation 3:

$$e\text{-limit}=(p\text{-limit})\times k \quad (3)$$

where e-limit is the erase suspend-limit, and k is a proportional constant.

In the memory controller according to an embodiment of the disclosure, the proportional constant may be the number of pages per block in the flash memory.

In the memory controller according to an embodiment of the disclosure, the erase/program suspend-limit determined by the suspend-limit changer may be stored in the memory channel controllers.

In the memory controller according to an embodiment of the disclosure, the memory channel controllers may be configured to count the number of erase/program suspend operations, and upon input of a read command during the erase/program operation to process a write command in the read/write command from the host, perform the read operation after suspending the ongoing erase/program operation, when the number of erase/program suspend operations is less than the erase/program suspend-limit. The memory channel controllers may resume the suspended erase/program operation after the read operation completes.

According to an embodiment of the disclosure, a storage device includes a flash memory, and a memory controller controlling the flash memory.

The features and advantages of the disclosure will become more apparent from the following description based on the attached drawings.

The terms or words used in the specification and claims should not be interpreted in a conventional and lexical sense. Rather, they should be interpreted as meanings and concepts consistent with the technical idea of the disclosure based on the principle that the inventor can appropriately define the concept of terms in order to explain his or her invention in the best way.

According to the present disclosure, write QoS and read QoS can be maintained consistent despite a change in host workload characteristics, by dynamically changing allowed numbers of erase suspend and program suspend operations.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
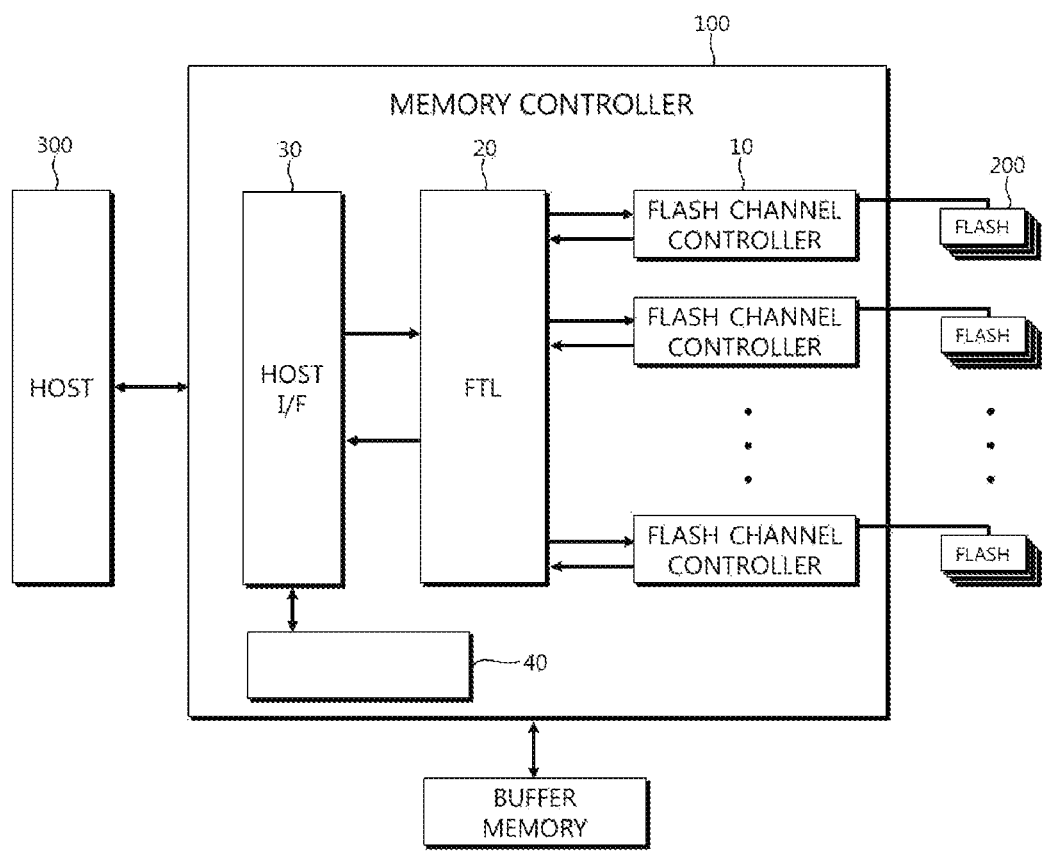
FIG. 1 is a block diagram illustrating a memory controller according to an embodiment of the disclosure.

The objects, specific advantages, and novel features of the disclosure will become more apparent from the following detailed description and preferred embodiments, examples of which are illustrated in the accompanying drawings. The same reference numerals and signs denote the same or like components even when they are shown in different accompanying drawings from one another. The term as used in the disclosure, "$1^{st}$" "$2^{nd}$" "first" or "second" may be used for the names of various components, not limiting the components. These expressions are used only to distinguish one component from another component. Lest it should obscure the subject matter of the disclosure, a detailed description of well-known technologies is avoided.

Preferred embodiments of the disclosure will be described below in detail with reference to the attached drawings.

FIG. 1 is a block diagram illustrating a memory controller according to an embodiment of the disclosure.

Referring to FIG. 1, a memory controller 100 according to an embodiment of the disclosure includes memory channel controllers 10 that perform erase, program, read, erase suspend, and program suspend operations for flash memories 200, a flash translation layer (FTL) 20 that controls an operation of a memory channel controller 10 by receiving a write/read command and transmits a completion for the write/read command, a host interface (I/F) 30 that receives the write/read command from a host 300, transmits the received write/read command to the FTL 20, receives the completion from the FTL 20, and calculates a write/read latency for the write/read command, and a suspend-limit changer 40 that dynamically changes a maximum allowed number of erase/program suspend operations referred to as an erase/program suspend-limit based on the calculated write/read latency.

The disclosure relates to a memory controller that controls a flash memory in a storage device. Although erase/program suspend is used to improve quality of service (QoS) of the storage device, when an allowed number of erase/program suspend operations is set to be too small, read QoS is decreased, whereas when the allowed number of erase/program suspend operations is set to be too large, write QoS is decreased. The disclosure is devised to overcome this problem.

Specifically, the memory controller 100 according to the disclosure includes the memory channel controllers 10, the FTL 20, the host I/F 30, and the suspend-limit changer 40.

Each of the memory channel controllers 10 performs erase, program, read, erase suspend, and program suspend operations for a flash memory 200 connected to the memory channel controller 10 via a channel. These operations are performed in response to a flash erase command, a flash program command, and a flash read command from the FTL 20.

The memory channel controller 10 fetches a command from a queue into which flash commands are placed by the FTL 20. When a target flash memory 200 to which the command has been issued is idle, the memory channel controller 10 executes the command and transmits completion information attached with an execution result to the FTL 20. On the contrary, when the target flash memory 200 is busy, that is, when the target flash memory 200 is executing a previous command, the memory channel controller 10 waits until the flash memory 200 is idle and then executes the new command, or suspends the ongoing command which is being executed, preferentially executes the new command, and then resumes the execution of the suspended command. It is determined whether to suspend the ongoing command according to the priority of the command. A higher priority may be assigned to the flash read command than the flash erase or program command. A suspended and then resumed flash erase or program operation may be suspended again. However, a maximum allowed number of erase/program suspend operations may be limited. When the maximum allowed number of erase/program suspend operations is exceeded, a corresponding erase or program operation is executed without being suspended, even though a higher-priority command is input. Hereinafter, the maximum allowed number of erase/program suspend operations is defined as an erase/program suspend-limit. The erase/program suspend-limit may be divided into an erase suspend-limit and a program suspend-limit.

The FTL 20 receives a write/read command and controls an operation of the memory channel controller 10. The write/read command, which is received from the host 300 through the host I/F 30, may be divided into a host write command and a host read command.

The FTL 20 may perform write buffering and buffer flush in response to the host write command. Upon receipt of the host write command, the FTL 20 allocates a buffer space in a buffer memory, temporarily stores host data in the allocated buffer space, and then transmits a write completion to the host 300 through the host I/F 30. This process is referred to as write buffering. Subsequently, to store the buffered data to the flash memory 200, the FTL 20 transmits a flash program command to the memory channel controller 10. Upon receipt of a flash program completion, the FTL 20 records the physical address of the flash memory 200 at which the data has been stored in a mapping table and deallocates the buffer space. This process is referred to as buffer flush. Because fast transmission of a completion to the host is possible by the write buffering, a write latency is improved. The buffer flush is performed in the background. Therefore, although the buffer flush does not affect performance that the host 300 experiences, too late buffer flush results in exhaustion of an available buffer space that may be allocated to the buffer memory, thereby lengthening the latency of a subsequent host write command.

Upon receipt of the host read command, the FTL 20 first determines whether requested data exists in a buffer space. In the presence of the data in the buffer, the FTL 20 transmits the data and then a completion to the host 300. On the contrary, in the absence of the buffered data, the FTL 20 obtains a physical address of the flash memory 200, at which the data is located, referring to the mapping table, transmits a flash read command to the memory channel controller 10, and thus transmits the data of the flash memory 200 and a completion to the host 300.

In addition, the FTL 20 performs garbage collection (GC). Only when a page of the flash memory 200 is free, writing on the page is possible, with no overwrite allowed. Accordingly, to program new data, a block of the flash memory 200 composed of multiple pages should first be erased. A block which has been erased and thus is programmable is called a free block. To program write-buffered data to the flash memory 200, a free block should exist. An operation of generating free blocks is called GC.

The host I/F 30 interfaces with the host 300. The host I/F 30 may be connected to the host 300 via at least one channel or port. For example, the host I/F 30 may be connected to the host 300 via one or all of a parallel AT attachment (PATA) bus, a serial AT attachment (SATA) bus, and a peripheral component interconnect express (PCIe) bus. Alternatively, the host I/F 30 may be connected to the outside via a small computer system interface (SCSI), a universal serial bus (USB), or the like.

The host I/F 30 receives a write/read command from the host 300, transmits the write/read command to the FTL 20, receives a completion corresponding to the transmitted write/read command from the FTL 20, and transmits the completion to the host 300. The host I/F 30 calculates a latency for the write/read command. The calculated write/read latency includes a write latency and a read latency, which are used as basic data for dynamically changing the erase/program suspend-limit.

The suspend-limit changer 40 dynamically changes the erase/program suspend-limit based on the write/read latency calculated by the host I/F 30. The suspend-limit changer 40 may be implemented in hardware or software. That is, the suspend-limit changer 40 may be implemented in the form of a digital or analog circuit inside the memory controller 100, or may be implemented as a separate chip or module and connected to the memory controller 100. Further, the suspend-limit changer 40 may be implemented by storing and executing software in an internal memory such as an SRM or an external memory such as a floppy disk, a compact disk, or a USB. Further, the suspend-limit changer 40 may be implemented in a form programmable by a user. Further, the suspend-limit changer 40 may be incorporated with the FTL 20 or the host I/F 30. That is, in addition to the afore-described original functions of the FTL 20 or the host I/F 30, the FTL 20 or the host I/F 30 may execute all or some of the functions of the suspend-limit changer 40.

The suspend-limit changer 40 sends the erase/program suspend-limit to the memory channel controller 10 after changing the erase suspend-limit and/or the program suspend-limit. Upon input of a command with a higher priority than an ongoing command, the memory channel controller 10 performs a suspend operation only when the number of suspend operations performed so far is less than the suspend-limit, without unconditionally suspending an erase or program operation. Because the suspend-limit is changed based on a write/read latency obtained from an actual operation, the write QoS and the read QoS may be maintained consistent even though host workload characteristics are changed.

An embodiment of determining an erase/program suspend-limit will be described below.

Figure 2:
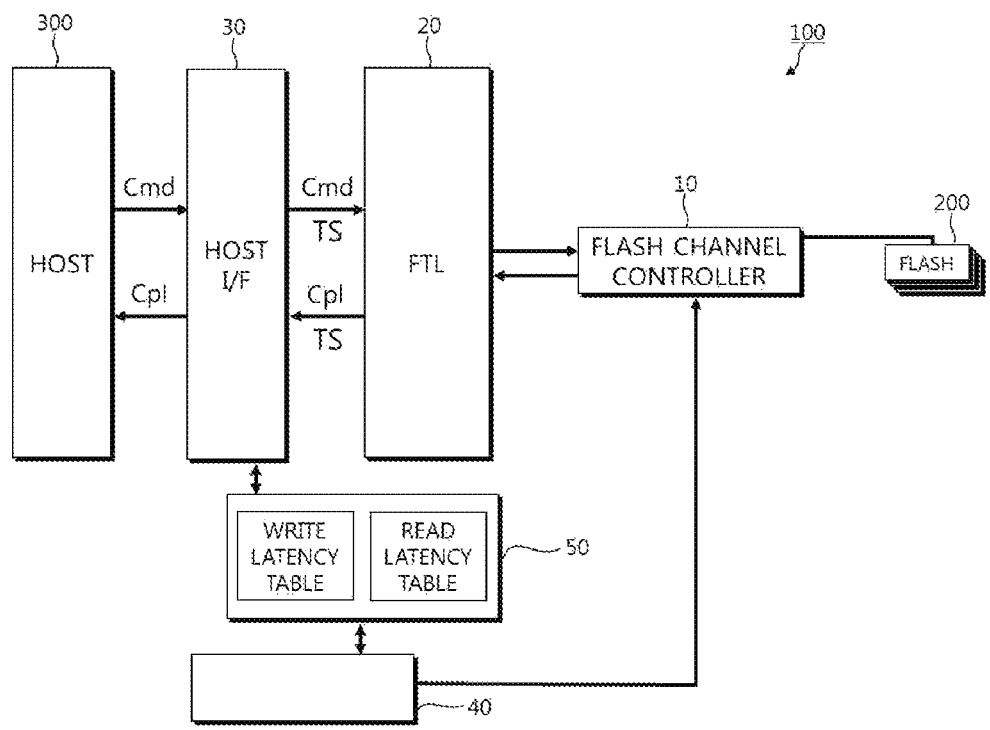
FIG. 2 is a block diagram illustrating an operation of the memory controller illustrated in FIG. 1.
Figure 3:
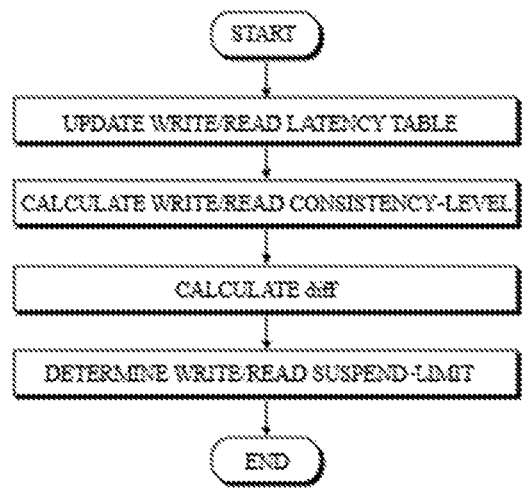
FIG. 3 is a flowchart illustrating a method of operating the memory controller according to the disclosure.

FIG. 2 is a block diagram illustrating an operation of the memory controller illustrated in FIG. 1, and FIG. 3 is a flowchart illustrating a method of operating the memory controller according to the disclosure.

Referring to FIGS. 2 and 3, to calculate a write/read latency, upon input of a write/read command Cmd, the host I/F 30 generates a timestamp TS referring to a global timer and transmits the command Cmd attached with the timestamp TS to the FTL 20. The FTL 20 transmits a completion Cpl corresponding to the command Cmd to the host I/F 30, returning the received timestamp TS as it is. Upon receipt of the completion Cpl, the host I/F 30 calculates a write latency and a read latency based on the time difference between the reception time of the completion Cpl and the timestamp TS included in the completion Cpl, referring again to the global timer. The calculated write/read latency is reflected in an already-prepared write/read latency data structure.

The write/read latency data structure may be prepared as a table listing the number of write commands and the number of read commands for each of latency items defined as specific time ranges. For example, the table may be made out as Table 1 below.

TABLE 1

| Latency range (μs) | # of write command |
|---|---|
| Less than 100 | 2531 |
| 100~200 | 5527 |
| 200~300 | 3100 |
| ... | |
| 9,900~10,000 | 2 |
| More than 10,000 | 0 |

This write/read latency data structure may be stored in a memory 50. The memory 50 may be provided as a separate memory such as an SRAM or part of an existing buffer memory may be used as the memory 50. The suspend-limit changer 40 calculates a write consistency-level and a read consistency-level based on the write/read latency data structure, for use in evaluating variations of the latencies.

For example, the write consistency-level may be calculated by Equation 1.

$$\text{Write consistency-level}=(MW_{Latency})/(SW_{Latency}) \quad (1)$$

where $MW_{Latency}$ is an average latency for write commands, and $SW_{Latency}$ is a standard deviation of latency for write commands.

For example, the read consistency-level may be calculated by Equation 2.

$$\text{Read consistency-level}=(MR_{Latency})/(SR_{Latency}) \quad (2)$$

where $MR_{Latency}$ is an average latency for read commands, and $SR_{Latency}$ is a standard deviation of latency for read commands.

As the standard deviation of latency increases, the consistency of latency decreases. However, it is not appropriate to directly compare the standard deviations of latency for write and read. This is because the latency features (particularly, average latencies) of write and read are fundamentally different in view of write buffering. Therefore, a standard deviation may be normalized by dividing the standard deviation by an average latency and the reciprocal of the normalized standard deviation is taken, thereby calculating a consistency-level.

Once the write/read consistency-level is obtained as such, the suspend-limit changer 40 may determine an erase/program suspend-limit based on an evaluation result from comparing the write consistency-level and the read consistency-level.

For example, the program suspend-limit may be determined according to the following condition using a level difference calculated by subtracting the read consistency-level from the write consistency-level as the evaluation result.

If diff<0, p-limit=0.
If diff≥0, p-limit=[diff]

where diff is the level difference, p-limit is the program suspend-limit, and [ ] is a function of converting a real number to an integer. This function may be a ceiling function, a floor function, or a rounding function.

For example, when [ ] is a ceiling function and diff is 1.3, the program suspend-limit is 2. Accordingly, only a maximum of two program suspend operations are allowed for a single program operation.

The erase suspend-limit may be determined separately from the program suspend-limit, by Equation 3.

$$e\text{-limit}=(p\text{-limit})\times k \quad (3)$$

where e-limit is the erase suspend-limit, and k is a proportional constant. Herein, k is an integer equal to or larger than 1, which may be determined based on relative requirements for program performance and erase performance, for example, the number of pages per block in the flash memory 200.

The erase/program suspend-limit determined by the suspend-limit changer 40 in this manner may be stored separately, for example, in the memory channel controller 10.

The memory channel controller 10 performs an operation for the flash memory 200, using the erase/program suspend-limit. The memory channel controller 10 counts the number of times a specific erase or program command has been suspended, that is, the number of erase suspend operations and the number of program suspend operations. Upon receipt of a read command with a higher priority during an erase or program operation corresponding to a write command, the memory channel controller 10 compares the count of suspend operations with the suspend-limit. Then, only when the count is less than the suspend-limit, the memory channel controller 10 performs a suspend operation and then a read operation.

The memory controller according to the disclosure is applicable to a storage device, which will be described below.

Figure 4:
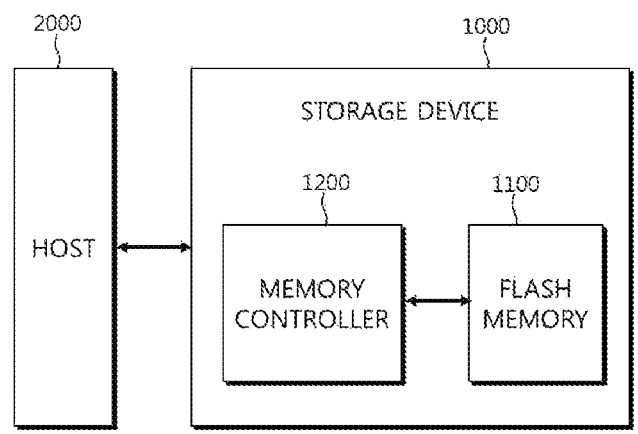
FIG. 4 is a block diagram illustrating a storage device according to an embodiment of the disclosure.
Figure 5:
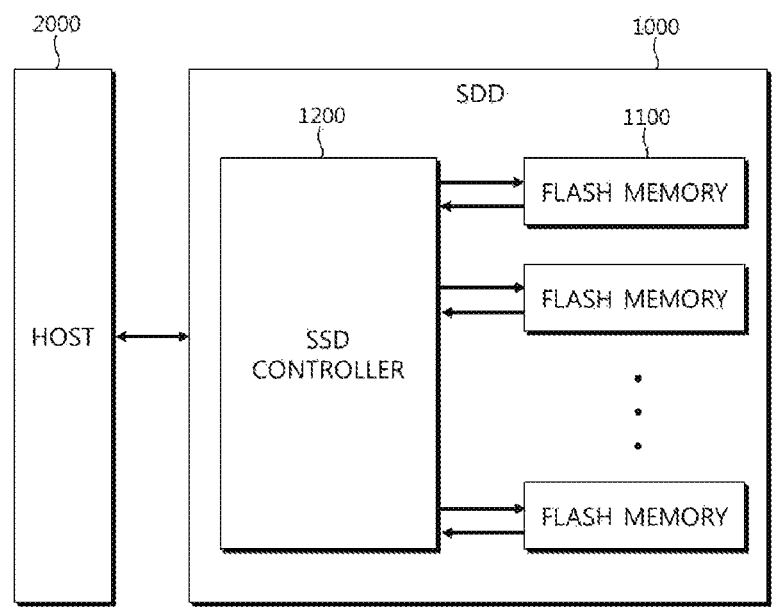
FIG. 5 is a block diagram illustrating a solid-state drive (SSD) to which the storage device according to the embodiment of the disclosure is applied.

FIG. 4 is a block diagram illustrating a storage device according to an embodiment of the disclosure, and FIG. 5 is a block diagram illustrating a solid-state drive (SSD) to which the storage device according to the embodiment of the disclosure is applied.

Referring to FIG. 4, a storage device 1000 according to an embodiment of the disclosure may include a flash memory 1100 and a memory controller 1200 controlling the flash memory 1100.

The storage device 1000 may include a memory card or a detachable mobile storage device. The storage device 1000 is used in connection to a host 2000 and exchanges data with the host 2000 via an interface (I/F) of the host 2000. The storage device 1000 may perform an internal operation by receiving power from the host 2000.

As described before, read and erase/program suspend operations of the flash memory 1100 are controlled based on an erase/program suspend-limit changed dynamically by the memory controller 1200. A related operation control has been described before and thus its detailed description is avoided herein.

Referring to FIG. 5, the storage device 1000 according to the disclosure may be a solid-state drive (SSD).

Because the SSD is connected to the host 2000, the host 2000 may write data to or read stored data from the SSD. The SSD may exchange signals with the host 2000 via the host I/F and receive power from the host 2000 via a power connector. The SSD may include a plurality of flash memories 1100 and an SSD controller. The plurality of flash memories 1100 may be connected to the SSD controller via a plurality of channels. One channel may be connected to one or more flash memories 1100 and the flash memories 1100 connected to one channel may be connected to the same data bus.

The memory controller 1200 according to the disclosure is provided as the SSD controller and exchanges signals with the host 2000 via the host I/F. The signals may carry commands, addresses, and data, and data is written to or read from a corresponding flash memory 1100 according to a command from the host 2000.

While the disclosure has been described in detail with reference to specific embodiments, the embodiments are intended only for describing the disclosure, not limiting the disclosure. It is apparent to those skilled in the art that many variations or modifications can be made without departing the scope and spirit of the disclosure.

Simple modifications and changes of the disclosure fall within the scope of the disclosure and the specific protection scope of the disclosure will become apparent from the appended claims.

What is claimed is:

1. A memory controller comprising:
   memory channel controllers configured to perform erase, program, read, and erase/program suspend operations for flash memories;
   a flash translation layer configured to control an operation of the memory channel controllers to process write/read commands, and transmit completions for the write/read commands;
   a host interface configured to forward the write/read commands from a host to the flash translation layer, forward the completions from the flash translation layer to the host, and calculate write/read latencies for the write/read commands when forwarding the associated completions; and
   a suspend-limit changer configured to dynamically change an erase/program suspend-limit based on the calculated write/read latencies, the erase/program suspend-limit being a maximum allowed number of erase/program suspend operations for a single erase/program operation.

2. The memory controller according to claim 1, wherein the host interface is configured to:
   generate a timestamp when receiving a write/read command, transmit the timestamp along with the write/read command, receive the timestamp along with the completion, and calculate the write/read latency based on a difference between the timestamp and a reception time of the timestamp; and
   reflect the calculated write/read latency in a write/read latency data structure in which the number of write commands and the number of read commands are recorded for each of latency items defined as specific time ranges.

3. The memory controller according to claim 2, further comprising a memory configured to store the write/read latency data structure.

4. The memory controller according to claim 2, wherein the suspend-limit changer is configured to:
   calculate a write consistency-level and a read consistency-level based on the write/read latency data structure, the write consistency-level and the read consistency-level being used for evaluating a latency variation; and
   determine the erase/program suspend-limit based on an evaluation result from comparing the write consistency-level and the read consistency-level.

5. The memory controller according to claim 4, wherein the write consistency-level is calculated by Equation 1, and the read consistency-level is calculated by Equation 2:

$$\text{Write consistency-level} = (MW_{Latency})/(SW_{Latency}) \quad (1)$$

$$\text{Read consistency-level} = (MR_{Latency})/(SR_{Latency}) \quad (2)$$

where $MW_{Latency}$ is an average latency for write commands, $SW_{Latency}$ is a standard deviation of latency for the write commands, $MR_{Latency}$ is an average latency for read commands, and $SR_{Latency}$ is a standard deviation of latency for the read commands.

6. The memory controller according to claim 4, wherein the suspend-limit changer is configured to use a level difference calculated by subtracting the read consistency-level from the write consistency-level as the evaluation result, and determine a program suspend-limit in the erase/program suspend-limit according to the following condition:
   If diff<0, p-limit=0
   If diff≥0, p-limit=[diff]
   where diff is the level difference, p-limit is the program suspend-limit, and [ ] is a function of converting a real number to an integer.

7. The memory controller according to claim 6, wherein the suspend-limit changer is configured to determine an erase suspend-limit by Equation 3:

$$e\text{-limit} = (p\text{-limit}) \times k \quad (3)$$

where e-limit is the erase suspend-limit, and k is a proportional constant.

8. The memory controller according to claim 7, wherein the proportional constant is the number of pages per block in the flash memory.

9. The memory controller according to claim 4, wherein the erase/program suspend-limit determined by the suspend-limit changer is stored in the memory channel controller.

10. The memory controller according to claim 4, wherein the memory channel controllers are configured to:
    count the number of erase/program suspend operations; and
    upon input of a read command during the erase/program operation to process a write command in the read/write command from the host, perform an erase/program suspend operation and then the read operation, when the number of erase/program suspend operations is less than the erase/program suspend-limit.

11. A storage device comprising:
    a flash memory; and
    the memory controller controlling the flash memory according to claim 1.

* * * * *